United States Patent
Barchmann et al.

(10) Patent No.: US 6,806,562 B2
(45) Date of Patent: Oct. 19, 2004

(54) DEVICE WITH AT LEAST ONE SEMICONDUCTOR COMPONENT AND A PRINTED CIRCUIT BOARD AND METHOD OF ESTABLISHING AN ELECTROMECHANICAL CONNECTION BETWEEN THE TWO

(75) Inventors: Bernd Barchmann, Regensburg (DE); Erik Heinemann, Regensburg (DE); Josef Heitzer, Bach/Donau (DE); Frank Pueschner, Kelheim (DE)

(73) Assignee: Infineon Technologies AG, Munich (DE)

( * ) Notice: Subject to any disclaimer, the term of this patent is extended or adjusted under 35 U.S.C. 154(b) by 196 days.

(21) Appl. No.: 10/057,127

(22) Filed: Jan. 25, 2002

(65) Prior Publication Data

US 2002/0113311 A1 Aug. 22, 2002

(30) Foreign Application Priority Data

Jan. 25, 2001 (DE) .......................................... 101 03 456

(51) Int. Cl.[7] ............................................. H01L 23/02
(52) U.S. Cl. ........................ 257/686; 257/723; 257/678
(58) Field of Search ................................ 257/678, 686, 257/688, 723, 724; 361/784, 785

(56) References Cited

U.S. PATENT DOCUMENTS

| | | | | |
|---|---|---|---|---|
| 4,507,834 A | * | 4/1985 | Chen et al. | 29/26 R |
| 5,413,489 A | * | 5/1995 | Switky | 439/71 |
| 5,610,801 A | * | 3/1997 | Begis | 361/784 |
| 5,994,774 A | * | 11/1999 | Siegel et al. | 257/727 |

FOREIGN PATENT DOCUMENTS

| | | |
|---|---|---|
| EP | 0 954 208 A1 | 11/1999 |
| JP | 11 017 307 A | 1/1999 |

* cited by examiner

*Primary Examiner*—Richard Elms
*Assistant Examiner*—Brad Smith
(74) *Attorney, Agent, or Firm*—Laurence A. Greenberg; Werner H. Stemer; Ralph E. Locher

(57) ABSTRACT

A device having a semiconductor component and a printed circuit board are described. The semiconductor component has external contacts and the printed circuit board has contact terminals. The contact terminals display a central blind opening, into which the external contacts of the semiconductor component protrude and are in a force-locking engagement with the contact terminal areas. In the method of electromechanically connecting the two parts to form a device, after they have been aligned, the two components are merely pressed onto each other.

14 Claims, 2 Drawing Sheets

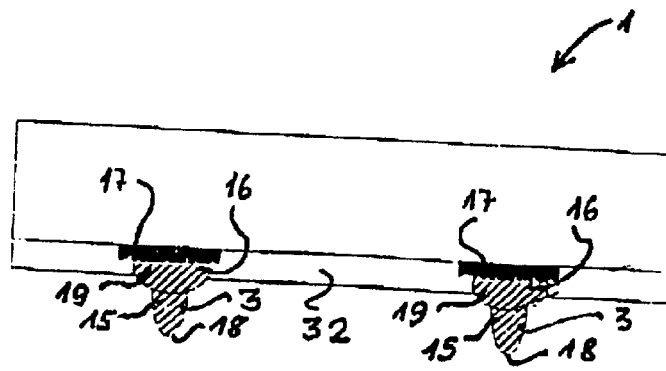
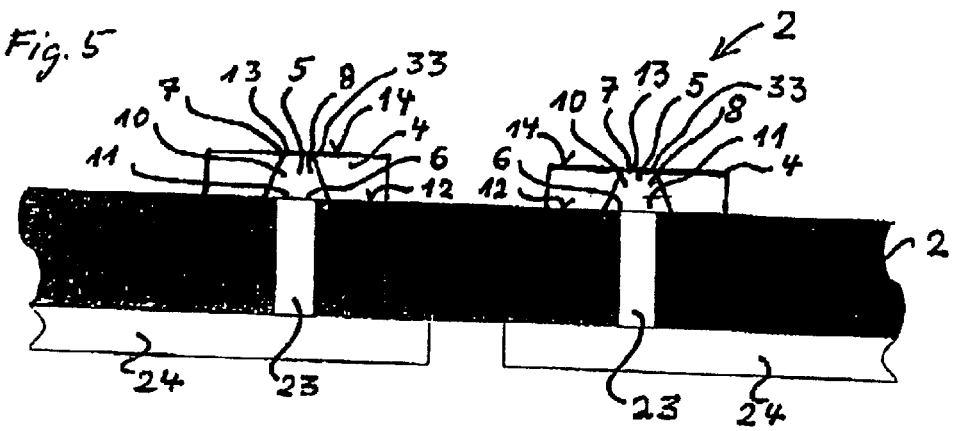
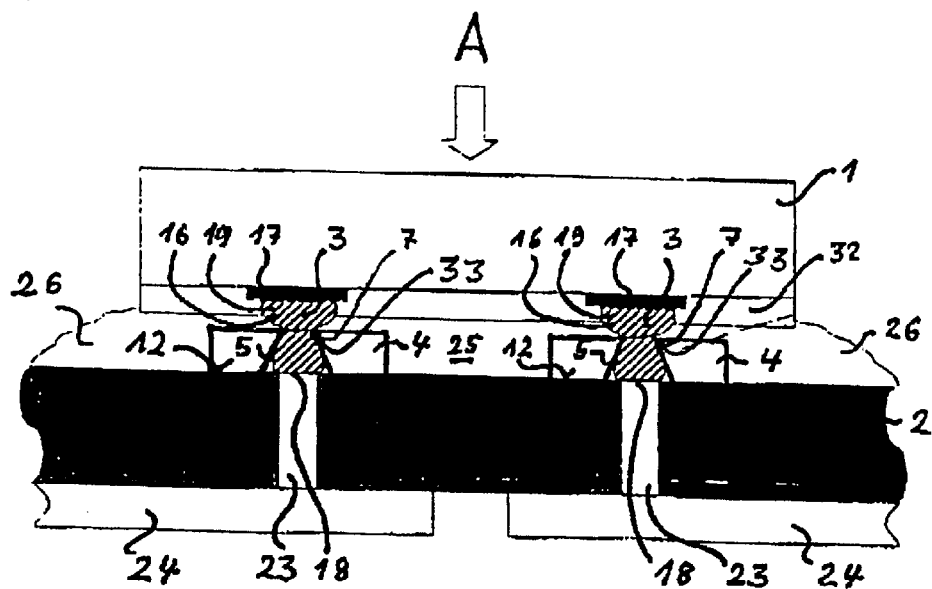

DEVICE WITH AT LEAST ONE SEMICONDUCTOR COMPONENT AND A PRINTED CIRCUIT BOARD AND METHOD OF ESTABLISHING AN ELECTROMECHANICAL CONNECTION BETWEEN THE TWO

BACKGROUND OF THE INVENTION

FIELD OF THE INVENTION

The invention relates to a device with at least one semiconductor component and at least one printed circuit board and to a method of establishing an electromechanical connection between the two.

For connecting a semiconductor component, in particular a semiconductor component using flip-chip technology, to a printed circuit board made of ceramic or plastic, the semiconductor chip must be pressed with its solderable external contacts onto contact terminals of the printed circuit board while being heated and subjected to pressure until a soldered connection is completely established and the solder has solidified. After that, the intermediate space between the semiconductor component and the printed circuit board can, if necessary, be filled with a filling material. As long as the solder has not solidified, it is necessary to hold the semiconductor component in position, it being possible for the aligning and holding in position to lead to incorrect placements, especially if vibrations and other disturbances displace the mutually aligned components with respect to one another.

SUMMARY OF THE INVENTION

It is accordingly an object of the invention to provide a device with at least one semiconductor component and a printed circuit board and a method of establishing an electromechanical connection between the two which overcome the above-mentioned disadvantages of the prior art devices and methods of this general type, in which the risk of maladjustment of the two components to be connected to each other is reduced.

With the foregoing and other objects in view there is provided, in accordance with the invention, a device containing at least one printed circuit board having contact terminals with central blind openings, and at least one semiconductor component having external contacts connected to the contact terminals on the printed circuit board. The external contacts of the semiconductor component protrude into the central blind openings and are in a force-locking engagement or a form-locking engagement with the contact terminals.

According to the invention, the device has the semiconductor component and the printed circuit board. The semiconductor component has external contacts, which are to be connected to contact terminals on the printed circuit board. The contact terminals on the printed circuit board have central blind openings, into which the external contacts of the semiconductor component protrude and are in at least a force-locking engagement with the contact terminals. The provision of central blind openings in the contact terminals of the printed circuit board has the effect of preventing a maladjustment after the semiconductor component has been mounted onto the printed circuit board, since the external contacts of the semiconductor component protrude with a force-locking engagement into the blind openings. This also dispenses with the need for providing a clasping device that fixes the semiconductor component on the printed circuit board during a soldering operation. Furthermore, on account of the force-locking engagement, which at the same time also brings about an electrical contact, a solder-free electrical connection is achieved between the external contacts of the semiconductor component and the contact terminals of the printed circuit board, so that the mounting and electrical connecting of the semiconductor component to the printed circuit board does not require any thermal treatment on account of the contact terminals according to the invention. The position of the semiconductor component on the printed circuit board can be supported and secured for a long time not only by the force-locking engagement itself but by an adhesive filler, which is disposed between the semiconductor component and the printed circuit board. In a further embodiment of the invention, the blind openings have a bottom region with greater dimensions than its top region. The external contacts of the semiconductor component protrude through the top region of the blind opening into the contact terminals and are deformed by the pressure applied to the semiconductor component in the blind openings in such a way that they are in a form-locking engagement with the contact terminals of the printed circuit board. The form-locking engagement is ensured by the greater dimensions of the bottom region of the blind openings. A semiconductor component which is in engagement in this way with such preformed contact terminals of the printed circuit board is anchored on the printed circuit board in such a way that the filling with the aid of a filler or an adhesive disposed in between is not absolutely necessary to ensure a durable electromechanical connection.

In a further embodiment of the invention, the central blind openings in the contact terminals are formed as slots. Such slot-shaped blind openings have the advantage that, when the semiconductor chip is mounted onto the contact terminals of the printed circuit board, a greater tolerance can be allowed during alignment, and nevertheless a secure durable electromechanical connection between the semiconductor component and the printed circuit board can be ensured.

In a further embodiment of the invention, the central blind openings in the contact terminals are pillar shaped. The pillar shape may have a polygonal cross section or a circular cross section and effect with its top region, which receives the external contacts of the semiconductor component, a plastic deformation of the external contacts during mounting, so that a force-locking electromechanical connection occurs.

In a further embodiment of the invention, it is envisaged to form the central blind openings in the contact terminals as truncated cones, the base area of which is disposed on the base area of the contact terminals and the tip of which is positioned on the surface of the contact terminals. Such a truncated cone has the effect that when the semiconductor component and the printed circuit board are being fitted together that the external contacts of the semiconductor component are deformed within the blind opening in the form of a truncated cone and widen toward the base area of the truncated cone, so that a form-locking electromechanical connection is produced between the external contacts of the semiconductor component and the contact terminals of the printed circuit board.

The external contacts of the semiconductor component may have a rivet form in cross section, the rivet head being connected to the contact area of the semiconductor component and the rivet tip protruding out of the semiconductor component. The contact areas of the semiconductor component may either be disposed directly on a semiconductor chip or on a wiring film that is disposed on the active upper side of the semiconductor chip. The rivet tip protrudes out of the semiconductor component, so that the semiconductor component can be attached by the flip-chip technique on a printed circuit board and can be electromechanically connected to the contact terminals of the printed circuit board. The rivet tips of the rivet form facilitate the insertion of the external contacts into the blind openings of the contact terminals of the printed circuit board when the semiconductor component and the printed circuit board are assembled to form a device according to the invention. Depending on the formation of the blind opening in the material of the contact terminals of the printed circuit board, a force-locking engagement, for example in the case of a pillar form of the blind opening, or a form-locking engagement, for example in the case of a frustoconical form of the blind opening, can be brought about. For this purpose, the tip of the rivet form has smaller dimensions than the central blind opening of the contact terminals of the printed circuit board, while the foot region of the rivet form has greater dimensions than the blind opening of the printed circuit board. This ensures that the external contacts of the semiconductor component can be inserted relatively unproblematically into the blind openings of the contact terminals of the printed circuit board during assembly.

A further embodiment of the invention provides that the external contacts of the semiconductor component have a frustoconical form in cross section, the tip of the truncated cone having smaller dimensions than the central blind opening and the foot region of the truncated cone having greater dimensions than the central blind opening. In the case of such an embodiment of the external contacts, they can be inserted into the blind openings by pressing the semiconductor component onto the printed circuit board, with the frustoconical cross section of the external contacts being deformed. The insertion of the frustoconical external contacts into the blind openings is facilitated by the tip of the truncated cone, which is of smaller dimensions than the central blind opening. Ceramic printed circuit boards or plastic printed circuit boards may be provided as the printed circuit board, a further embodiment of the invention provides that the printed circuit boards are formed in multiple layers with conductor track layers and vias connecting the conductor track layers.

A further embodiment of the invention provides that the printed circuit board has under each central blind opening a via, which is in connection with a buried conductor track of a multilayer printed circuit board or with a conductor track on the rear side of the printed circuit board. The metallic vias improve the electrical conductivity when the external contacts of the semiconductor component are inserted into the blind opening of the contact terminals of the printed circuit board.

To ensure a positive engagement between a specially formed blind opening of the contact terminals of the printed circuit board and the external contacts of the semiconductor component, the external contacts of the semiconductor component are produced from a plastically deformable metal alloy. The deformable metal alloy may have a silver solder alloy. While the material of the external contacts of the semiconductor component is a relatively soft material, the material of the contact terminals of the printed circuit board are formed from hard material. Consequently, when the semiconductor component is being assembled with the printed circuit board, the form of the blind opening in the contact terminals of the printed circuit board is impressed onto the external contacts of the semiconductor component.

In a further embodiment of the invention, the material of the contact terminals of the printed circuit board is a copper alloy, which is significantly harder than a silver solder alloy of the external contacts of the semiconductor component.

A method of establishing an electromechanical connection between at least one semiconductor component and at least one printed circuit board can be established by the following method steps: providing a semiconductor component with external contacts, which have a rivet form and/or a frustoconical form, providing a printed circuit board, which has contact terminals with central blind openings, aligning and bringing together the semiconductor component and the printed circuit board, so that the external contacts of the semiconductor component can engage force-lockingly in the central blind openings of the contact terminals of the printed circuit board, with a pressing force being applied, and/or engage form-lockingly in them, with plastic deformation of the external contacts.

In the method, all that takes place, advantageously, is that the semiconductor component in the form of a semiconductor chip is pressed with corresponding external contact terminals onto the printed circuit board, so that it is possible to dispense completely with heating the two components. If the materials of the external contacts and of the contact terminals with their blind openings are made to match each other in their hardness, an at least force-locking connection can be achieved by the pressing of the semiconductor component onto the printed circuit board, with the external contacts of the semiconductor component being inserted into the blind openings of the contact terminals.

Following the electromechanical connection of the semiconductor component by its external contacts and the contact terminals of the printed circuit board to the printed circuit board, the intermediate space between the semiconductor component and the printed circuit board can be filled with a filler. In one example of how the method is carried out, the filler may be a two-component adhesive, which cures or is cross-linked at room temperature and consequently establishes a high-temperature-resistant mechanical connection between the semiconductor component and the printed circuit board.

In a further example of how the method is carried out, the external contacts of the semiconductor component are held by a micromechanical clamping effect in the central blind openings of the contact terminals of the printed circuit board during the adhesive bonding of the semiconductor component to the printed circuit board and are electromechanically connected. Since the contact terminals of the printed circuit board have a thickness of a few $\mu$m and the dimensions of the central blind openings in the contact terminals and the dimensions of the external contacts of the semiconductor component have dimensions between 10 $\mu$m to a few 100 $\mu$m, the clamping effect in a force-locking or form-locking engagement is restricted to the thickness of the contact terminals of only a few $\mu$m. A micromechanical clamping effect is further improved by microfusion effects being able to occur during the micromechanical clamping, increasing the reliable and prolonged durability of the electromechanical connections between the semiconductor component and the printed circuit board.

To sum up, it can be stated that, with the device according to the invention and the method according to the invention, a reliable electrically conductive connection can be established between the die pads or the external contacts of the semiconductor component and the substrate pads or the contact terminals of a printed circuit board. The device according to the invention and the method avoid a constant application of pressure to the components being joined, that is the semiconductor component and the printed circuit board, during soldering or adhesive bonding until a solder cools down or an adhesive or filler cures.

An additional deforming of the stud bumps or external contacts of the semiconductor component during the die bonding, the connecting of the semiconductor component to the printed circuit board, has the effect of producing a positive connection. Consequently, the filler to be cured between the printed circuit board and the semiconductor component can be cured without pressure being applied. Therefore, a significant simplification of the mounting process when mounting semiconductor components of the BOC type (Board-on-Chip type) by flip-chip technology, is achieved, since there is no need for a pressure-applying device or a pressure-applying station. A rivet or wedge form of the external contacts of the semiconductor component or of the stud bumps allows the assembly and electromechanical connection of a semiconductor component with the printed circuit board to be significantly simplified.

Other features which are considered as characteristic for the invention are set forth in the appended claims.

Although the invention is illustrated and described herein as embodied in a device with at least one semiconductor component and a printed circuit board and a method of establishing an electromechanical connection between the two, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a cross-sectional view of the semiconductor component with rivet-shaped external contacts;

FIG. 5 is a cross-sectional view of the printed circuit board with contact terminals which have the frustoconical blind openings; and FIG. 6 is a cross-sectional view of a second embodiment of the printed circuit board connected to the semiconductor component.

DESCRIPTION OF THE PREFERRED EMBODIMENTS

Figure 1:
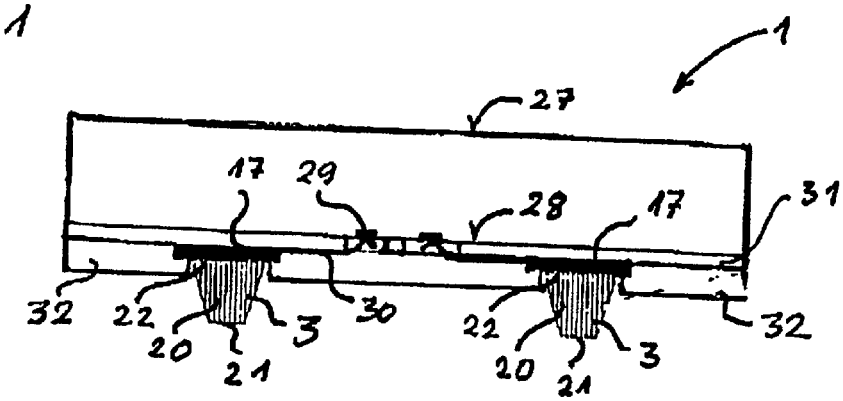
FIG. 1 is a diagrammatic, cross-sectional view of a semiconductor component with frustoconical external contacts according to the invention.

In all the figures of the drawing, sub-features and integral parts that correspond to one another bear the same reference symbol in each case. Referring now to the figures of the drawing in detail and first, particularly, to FIG. 1 thereof, there is shown a schematic cross-sectional view of a semiconductor component 1 with frustoconically shaped external contacts 3. The semiconductor component 1 has a passive rear side 27 and an active front side 28, which for example carries an integrated circuit. Disposed on the active front side 28 of the semiconductor chip are lands 29, which are connected by wiring lines 30 to contact areas 17 of a wiring film 31. Disposed on the contact areas 17 are the frustoconically shaped external contacts 3 of the semiconductor component 1, the areas between the contact terminal areas 17 being covered by an insulating layer 32. A tip 21 of a frustoconical form 20 of the external contact 3 protrudes out of the semiconductor component 1 and is directed downward in FIG. 1, in order to connect the semiconductor component 1 electromechanically to a ceramic printed circuit board 2 or a plastic printed circuit board 2 by use of a flip-chip technology. Seen in cross section, the frustoconical form 20 forms a wedge that can be aligned in the direction of corresponding contact terminals 4 of the printed circuit board 2.

Figure 2:
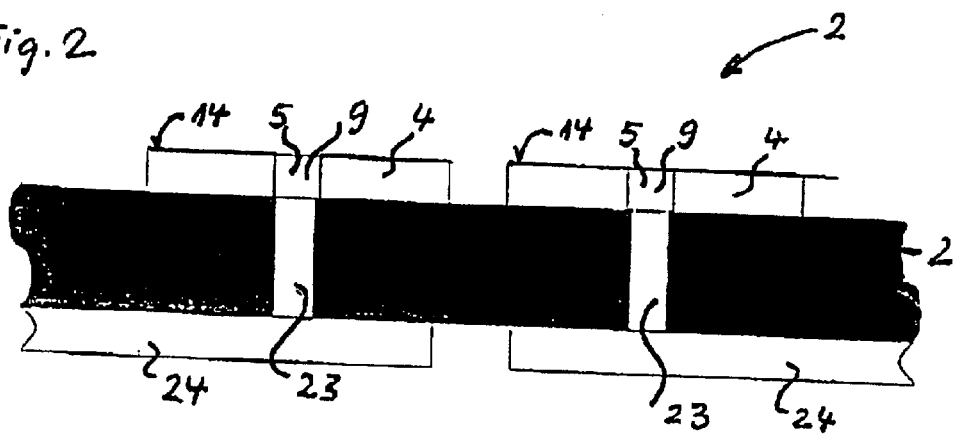
FIG. 2 is a cross-sectional view of a printed circuit board with contact terminals which have pillar-shaped central blind openings.

FIG. 2 shows a schematic cross-sectional view of the printed circuit board 2 with the contact terminals 4, which have a pillar-shaped central blind opening 5. The pillar-shaped central blind opening 5 may have a polygonal or circular cross section, the opening cross section being greater on a surface 14 of the contact terminals 4 than the cross section of the tip 21 of the frustoconical form 20 of the external contacts 3 of the semiconductor component 1 shown in FIG. 1. Beneath the pillar-shaped central blind opening 5, each of the terminal contacts 4 has a via 23, which connects the contact terminal 4 to a conductor track 24 on the underside of the printed circuit board 2. In the case of multilayer printed circuit boards, which have a plurality of layers of conductor tracks 24, the via 23 may be connected to one of the conductor tracks 24 of an intermediate conductor-track layer.

Figure 3:
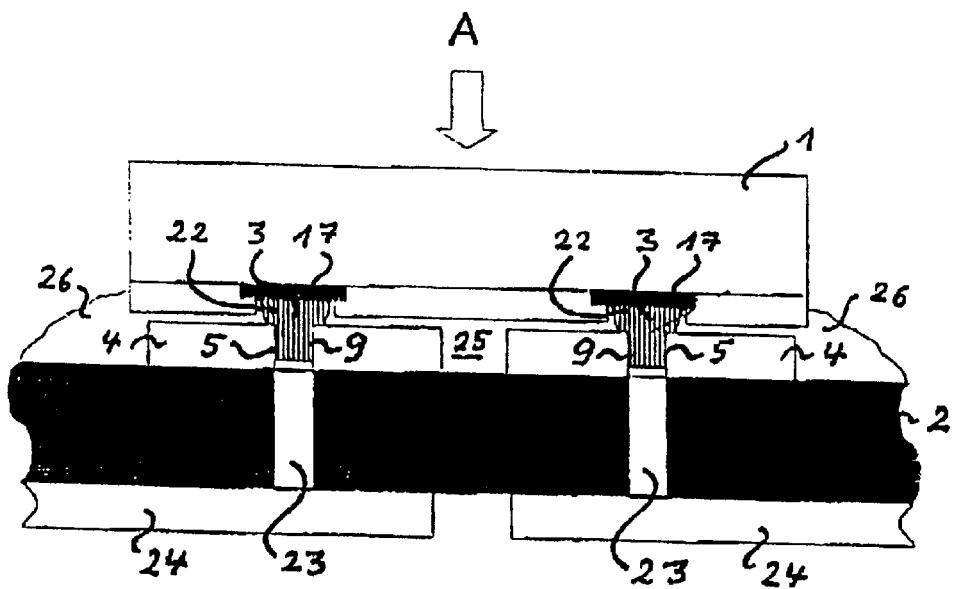
FIG. 3 is a cross-sectional view of a first embodiment of the printed circuit board connected to the semiconductor component.

By a simple step of adjusting the semiconductor component 1 with the external contacts 3 with respect to the printed circuit board 2 with the contact terminals 4, which for their part have the central blind openings 5, the two components, the semiconductor component 1 and the printed circuit board 2, can be aligned in relation to each other and joined together under pressure. During the pressing into place of the semiconductor component 1, the tips 21 of the frustoconical form or truncated cone form 20 are self-adjusting with respect to the somewhat larger blind openings 5 of the contact terminals 4 and are connected force-lockingly and electromechanically to the printed circuit board 2 by plastic deformation of the external contacts 3 in the pillar-shaped blind openings 5 of the contact terminals 4 of the printed circuit board 2 (see FIG. 3). A force-locking connection is one that connects two elements together by force external to the elements, as opposed to a form-locking connection, which is provided by the shapes of the elements themselves. The connection can be protected by positioning a filler 26 between the semiconductor component 1 and the printed circuit board 2. By using a two-component adhesive as the filler 26, an additional securement of the position of the semiconductor component 1 on the printed circuit board 2 can be provided. In the first embodiment of the invention, only a force-locking engagement is achieved between the two components, which is sufficient however, in particular when supported by the filler compound 26 that at the same time has an adhesive action, to ensure a durable electromechanical connection between the semiconductor component 1 and the printed circuit board 2.

FIG. 4 shows a schematic cross-sectional view of the semiconductor component 1 with rivet-shaped external contacts 3. The wiring film 31 and the lands 29 on the active upper side 28, as shown in FIG. 1, have been omitted in FIG. 4 for the sake of simplicity. In the embodiment of FIG. 4 of the semiconductor component 1, it essentially contains the semiconductor chip 1, which supports, by a non-illustrated wiring film, on its active upper side, the contact areas 17, onto which a rivet head 16 of the rivet-shaped external contact 3 is fastened, while a rivet tip 18 protrudes out of the semiconductor component 1. The rivet-shaped terminal contact 3 is produced from a soft plastically deformable material such as a silver solder material. The rivet head tip 18 is made to be relatively slender and smaller than the blind opening 5, so that the rivet head tip 18 fits into the corresponding blind opening 5 of the contact terminal 4 of the printed circuit board 2.

FIG. 5 shows a schematic cross-sectional view of the printed circuit board 2 with the contact terminals 4, which have frustoconically shaped blind openings 5. The frustoconically shaped blind openings 5 are disposed with their base area 11 in the region of a base area 12 of the contact terminals 4. A tip 13 of a truncated cone 10 terminates with a surface 14 of the contact terminals 4. The opening cross section of the blind opening 5 on the surface 14 of the contact terminals 4 is greater than the diameter of rivet tips 18 of the semiconductor component, which are shown in FIG. 4. Consequently, it is relatively easy to dispose the external contacts 3 in the blind openings 5 of the contact terminals 4. Slight pressure on the semiconductor component 1 has the effect that the external contacts 3 are deformed and form a form-locking connection with the frustoconical blind opening 5 of the contact terminals 4. A form-locking connection is one that connects two elements together due to the shape of the elements themselves, as opposed to a force-locking connection, which locks the elements together by force external to the elements. Disposed under each blind opening 5 is the via 23, which is in connection with the conductor track 24 on the underside of the printed circuit board 2. If the printed circuit board 2 has a plurality of layers of conductor tracks 24, the via 23 may also be connected to an intermediate layer of the conductor tracks 24. The material of the contact terminals 4 is harder than the material of the external contacts 3 of the semiconductor component 1 shown in FIG. 4. In particular when the component shown in FIG. 4 with its external contacts 3 and the printed circuit board 2 shown in FIG. 5 with its contact terminals 4 and the central frustoconical blind opening 5 are being pressed onto each other, sharp edges 33 of the central blind opening 5 work themselves into the material of the external contacts 3, so that a form-locking microclamping connection is produced between the semiconductor component 1 and the printed circuit board 2 by a microclamping effect.

FIG. 6 shows a schematic cross-sectional view of a second embodiment of the device according to the invention. In FIG. 6, components which display the same function as in the preceding figures are designated by the same reference numerals. The second embodiment of the invention differs from the embodiment of the invention, depicted in FIG. 3, in that the blind opening 5 does not have a pillar form but a frustoconical form. In this case, the blind opening 5 may also be an elongate slot that corresponds in cross section to a frustoconical form. An elongate slot has the advantage that the aligning of the semiconductor component 1 with respect to the contact terminals 4 of the printed circuit board 2 is made easier. As soon as the aligned semiconductor component 1 is pressed in the direction of arrow A onto the printed circuit board 2, the tip 18 of the rivet-shaped external contact 3 of the semiconductor component 1 is deformed and anchors the semiconductor component 1 in the blind opening 5 of the contact terminals 4 of the printed circuit board 2. For this purpose, the rivet-shaped external contact 3 is formed of a softer material than the contact terminal 4 of the printed circuit board 2. At the same time, when it penetrates into the blind opening 5 of the contact terminal 4, the tip 18 of the rivet-shaped external contact 3 electrically bonds the via 23, so that the external contact 3 of the semiconductor component 1 is connected to the conductor track 24 on the underside of the printed circuit board 2 by way of the via 23.

After the semiconductor component 1 has been aligned and mounted on the printed circuit board 2, an intermediate space 25 between the semiconductor component 1 and the printed circuit board 2 can be filled by the filler 26. During the filling process, it is not necessary to use auxiliary and holding tools to hold the semiconductor component 1 in an aligned position by clamping, since the anchorage of the external contacts 3 in the central blind openings 5 of the contact terminals 4 makes an additional clamping device superfluous.

We claim:

1. A device, comprising:
   at least one printed circuit board having contact terminals with central blind openings formed therein, said central blind openings having a top region and a bottom region with greater dimensions than said top region; and
   at least one semiconductor component having external contacts connected to said contact terminals on said printed circuit board, said external contacts of said semiconductor component protrude into said central blind openings and being in a form-locking engagement with said contact terminals.

2. The device according to claim 1, wherein said central blind openings are slot shaped.

3. A device, comprising:
   at least one printed circuit board having contact terminals with central blind openings formed therein, said central blind openings in said contact terminals being pillar shaped; and
   at least one semiconductor component having external contacts connected to said contact terminals on said printed circuit board, said external contacts of said semiconductor component protrude into said central blind openings and being in one of a force-locking engagement and a form-locking engagement with said contact terminals.

4. A device, comprising:
   at least one printed circuit board having contact terminals with central blind openings formed therein, said contact terminals having a base area and a top surface, said central blind openings having a truncated cone shape with a base area disposed in a region of said base area of said contact terminals and a tip positioned level to said top surface of said contact terminals; and
   at least one semiconductor component having external contacts connected to said contact terminals on said printed circuit board, said external contacts of said semiconductor component protrude into said central blind openings and being in one of a force-locking engagement and a form-locking engagement with said contact terminals.

5. A device, comprising:
   at least one printed circuit board having contact terminals with central blind openings formed therein; and
   at least one semiconductor component having external contacts connected to said contact terminals on said printed circuit board, said external contacts of said semiconductor component protrude into said central blind openings and being in one of a force-locking engagement and a form-locking engagement with said contact terminals, said semiconductor component having a contact area, said external contacts of said semiconductor component have a rivet form in cross section, said rivet form having a rivet head connected to said contact area of said semiconductor component and a rivet tip protruding out from said semiconductor component.

6. The device according to claim 5, wherein said rivet tip of said rivet form has smaller dimensions than said central blind openings of said contact terminals of said printed circuit board, said rivet form having a foot region with greater dimensions than said central blind openings.

7. A device, comprising:
   at least one printed circuit board having contact terminals with central blind openings formed therein; and
   at least one semiconductor component having external contacts connected to said contact terminals on said printed circuit board, said external contacts of said semiconductor component protrude into said central blind openings and being in one of a force-locking engagement and a form-locking engagement with said contact terminals, said external contacts of said semiconductor component have a frustoconical shape in cross section, said frustoconical shape having a tip with smaller dimensions than said central blind openings and a foot region with greater dimensions than said central blind openings.

8. The device according to claim 1, wherein said printed circuit board is a multi-layered ceramic printed circuit board.

9. The device according to claim 1, wherein said printed circuit board is a multi-layered plastic printed circuit board.

10. A device, comprising:
    at least one printed circuit board having contact terminals with central blind openings formed therein, said printed circuit board having conductor tracks and under each of said central blind openings a via in contact with said conductor tracks; and
    at least one semiconductor component having external contacts connected to said contact terminals on said printed circuit board, said external contacts of said semiconductor component protrude into said central blind openings and being in one of a force-locking engagement and a form-locking engagement with said contact terminals.

11. A device, comprising:
    at least one printed circuit board having contact terminals with central blind openings formed therein; and
    at least one semiconductor component having external contacts connected to said contact terminals on said printed circuit board, said external contacts of said semiconductor component protrude into said central blind openings and being in one of a force-locking engagement and a form-locking engagement with said contact terminals, said external contacts of said conductor component being formed from a plastically deformable metal alloy.

12. A device, comprising:
    at least one printed circuit board having contact terminals with central blind openings formed therein; and
    at least one semiconductor component having external contacts connected to said contact terminals on said printed circuit board, said external contacts of said semiconductor component protrude into said central blind openings and being in one of a force-locking engagement and a form-locking engagement with said contact terminals, said external contacts of said semiconductor component being formed from a silver solder alloy.

13. A device, comprising:
    at least one printed circuit board having contact terminals with central blind openings formed therein; and
    at least one semiconductor component having external contacts connected to said contact terminals on said printed circuit board, said external contacts of said semiconductor component protrude into said central blind openings and being in one of a force-locking engagement and a form-locking engagement with said contact terminals, said external contacts of said semiconductor component being formed of a material that is softer than a material of said contact terminals of said printed circuit board.

14. A device, comprising:
    at least one printed circuit board having contact terminals with central blind openings formed therein, said contact terminals being formed from a copper alloy; and
    at least one semiconductor component having external contacts connected to said contact terminals on said printed circuit board, said external contacts of said semiconductor component protrude into said central blind openings and being in a force-locking engagement and a form-locking engagement with said contact terminals.

* * * * *